(12) United States Patent
Honkura et al.

(10) Patent No.: US 7,026,812 B2
(45) Date of Patent: Apr. 11, 2006

(54) MAGNETIC SENSOR

(75) Inventors: Yoshinobu Honkura, Aichi (JP); Michiharu Yamamoto, Aichi (JP); Yoshiaki Koutani, Aichi (JP); Kazumasa Sumi, Aichi (JP); Masaki Mori, Aichi (JP)

(73) Assignee: Aichi Steel Corporation, Tokai (JP)

( * ) Notice: Subject to any disclaimer, the term of this patent is extended or adjusted under 35 U.S.C. 154(b) by 0 days.

(21) Appl. No.: 10/522,753

(22) PCT Filed: Aug. 18, 2004

(86) PCT No.: PCT/JP2004/011849

§ 371 (c)(1),
(2), (4) Date: Feb. 1, 2005

(87) PCT Pub. No.: WO2005/019851

PCT Pub. Date: Mar. 3, 2005

(65) Prior Publication Data
US 2006/0038561 A1  Feb. 23, 2006

(30) Foreign Application Priority Data
Aug. 25, 2003  (JP)  .............................. 2003-208682

(51) Int. Cl.
*G01R 33/00* (2006.01)
*G01R 33/02* (2006.01)
(52) U.S. Cl. ..................... 324/244; 324/253; 73/861.11
(58) Field of Classification Search ..................... None
See application file for complete search history.

(56) References Cited

FOREIGN PATENT DOCUMENTS

| JP | 2000-258517 | 9/2000 |
|---|---|---|
| JP | 2001-133529 | 5/2001 |
| JP | 2003-121517 | 4/2003 |

*Primary Examiner*—Bot LeDynh
(74) *Attorney, Agent, or Firm*—Oblon, Spivak, McClelland, Maier & Neustadt, P.C.

(57) ABSTRACT

A magnetic sensor includes a magnetic sensitive member 11 including an amorphous wire, a detection coil 12 wound around the magnetic sensitive member 11, and a sample-and-hold circuit for detecting a voltage induced in the amorphous wire 11 when a pulse current is interrupted. The sample-and-hold circuit has a sample-and-hold unit B31 and a delay circuit. The sample-and-hold unit B31 includes an electronic switch S31, a capacitor C32, a resistor R32, a resistor R33, and a high-input amplifier A31. The delay circuit includes a resistor R31 connected to a control terminal of the electronic switch S31 and a capacitor C31.

8 Claims, 16 Drawing Sheets

MAGNETIC SENSOR

TECHNICAL FIELD

The present invention relates to magnetic sensors for measuring weak magnetic fields with high precision.

BACKGROUND ART

A magnetic sensor having a coil wound around an amorphous wire is known as one conventional magnetic sensor including a magneto-impedance element. In such a magnetic sensor, for example, a method of extracting the first pulse of an oscillation waveform induced in a coil when a pulse current with a rise time of 5 nanoseconds is passed through an amorphous wire is used in order to obtain a voltage that sensitively varies in proportion to an external magnetic field $H_{ex}$ (see, for example, Patent Document 1).

Patent Document 1 discloses that a feedback coil is wound around an amorphous wire, a feedback circuit is provided, and a negative-feedback current proportional to a sensor output voltage is continuously passed through the feedback coil so as to perform a negative feedback, so that a magnetic sensor exhibiting high-precision characteristics with high linearity and no hysteresis is realized.

Patent Document 1: Japanese Unexamined Patent Application Publication No. 2000-258517.

DISCLOSURE OF THE INVENTION

Problems to be Solved by the Invention

However, the known magnetic sensor, as mentioned above, has the following problems: that is, in order to improve the precision of the magnetic sensor, the feedback circuit, as previously mentioned, is required, for example. Therefore, the circuitry becomes complex and the magnetic sensor may be large. On the other hand, if the feedback circuit is omitted, for example, the magnetic sensor may lack precision.

In particular, for a magnetic sensor installed in, for example, a cellular phone or personal digital assistant to measure direction, it is greatly desired that the magnetic sensor have simpler circuitry and higher precision. The known magnetic sensor, as mentioned above, may fail to satisfy such requirements.

Means for Solving the Problems

According to an aspect of the present invention, a magnetic sensor includes a magnetic sensitive member whose electromagnetic characteristics vary by the action of an external magnetic field; a driving circuit for supplying a current to the magnetic sensitive member; a detection coil wound around the magnetic sensitive member; and a sample-and-hold circuit for measuring an induced voltage value which is the magnitude of voltage induced in the detection coil, wherein the sample-and-hold circuit is configured to measure the induced voltage value in synchronization with an interruption of the current performed by the driving circuit.

It is known that, when a current is instantaneously passed through an amorphous wire constituting a magnetic sensitive member, a voltage corresponding to the magnitude of an external magnetic field acting on the amorphous wire is induced in a detection coil wound around the amorphous wire.

For example, FIGS. 13A and 13B show how a magnetic detection unit, in which a detection coil is wound around an amorphous wire, operates when an external magnetic field is +2 gauss (G).

FIG. 13A illustrates one example of a current waveform used to drive the amorphous wire, in which a current-carrying time of 35 nanoseconds (ns) is repeated at predetermined intervals. FIG. 13B illustrates voltages induced in the detection coil. For example, when a pulse current rises as shown in FIG. 13A, a positive damped oscillation voltage Q1 as shown in FIG. 13B is present in the detection coil, whereas when a pulse current falls, a negative damped oscillation voltage Q2 is present. The magnitude and polarity of the damped oscillation voltage are determined vectorially depending on the relationship between the magnitude of the external magnetic field and the angle between the direction of the external magnetic field and the axial direction of the amorphous wire. As a result, the magnitude of the external magnetic field can be determined from the damped oscillation voltage.

However, when the external magnetic field acting on the amorphous wire around which the detection coil is wound varies in the range of ±3G(gauss), a peak voltage value p1, which is the maximum value of the damped oscillation voltage induced in the detection coil when the pulse current rises, varies as shown in FIG. 14. As is apparent from FIG. 14, errors of approximately 8% nonlinearity and approximately 6% hysteresis are produced. Accordingly, a method for measuring an external magnetic field by measuring the voltage p1 when the pulse current rises is unsuitable for direction measurement requiring high precision.

The inventors of the present invention have carried out intensive research on the relationship in magnitude (see FIGS. 13A and 13B) between the voltage induced in the detection coil and the external magnetic field when the amorphous wire is driven by the pulse current, and based on the results obtained, the inventors have conceived the invention described below.

The present invention is characterized by comprising a magnetic sensitive member including an amorphous wire through which a pulse current can pass; a detection coil wound around the magnetic sensitive member; and a sample-and-hold circuit for detecting a voltage induced in the detection coil in synchronization with an interruption of the pulse current. In FIG. 13B, the damped oscillation voltage Q2, which is induced in the detection coil by the change in current when the pulse current passing through the amorphous wire falls by an interruption, is detected by the sample-and-hold circuit. As a result, the nonlinearity and the hysteresis characteristics are improved, and therefore, the precision is increased.

In the magnetic sensor according to the present invention, even if the feedback circuit, as previously mentioned, is omitted, for example, sufficient precision is realized. Therefore, the circuitry can be simplified, so that the magnetic sensor can be miniaturized and reduced in profile. In addition, omitting the feedback circuit, which requires a current continuously passing therethrough, can suppress power consumption.

Figure 1:
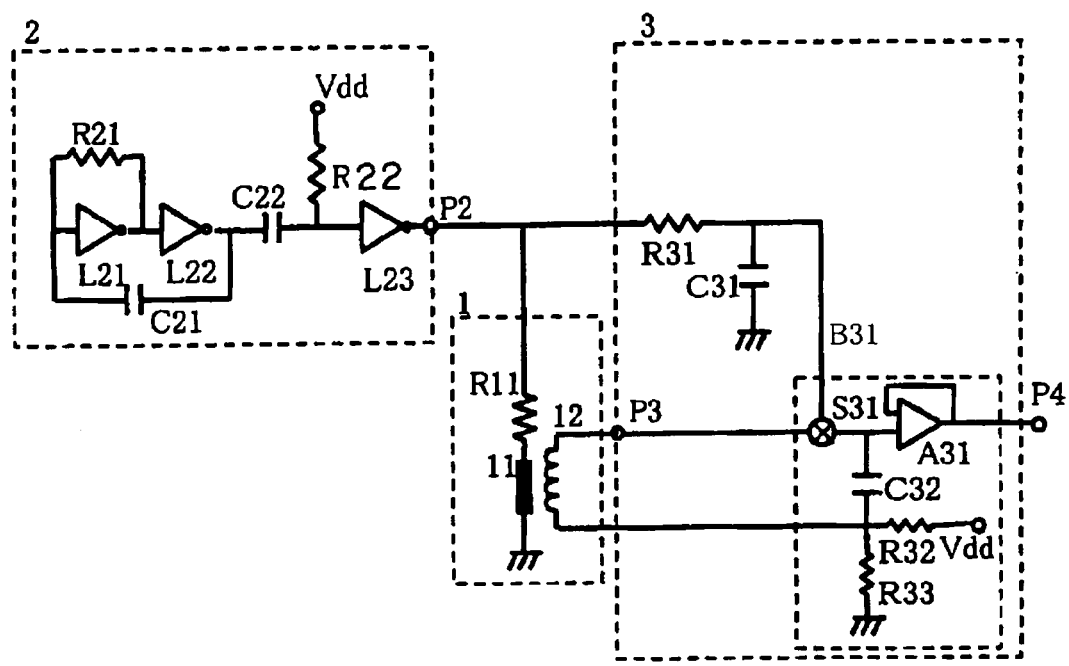
FIG. 1 is a schematic circuit diagram of a magnetic sensor according to embodiment 1.

REFERENCE NUMERALS 10 electrode wiring board
11 amorphous wire
12, 30 detection coil
2 pulse generator
20 magnetic sensitive member
31, 32 coil unit
40 insulating member (resin)
90 groove

BEST MODE FOR CARRYING OUT THE INVENTION

In the present invention, preferably, the sample-and-hold circuit may be configured to measure the first peak value in time in a damped oscillation waveform of the induced voltage value, the damped oscillation waveform varying with time in response to the interruption of the current.

Figure 13A:
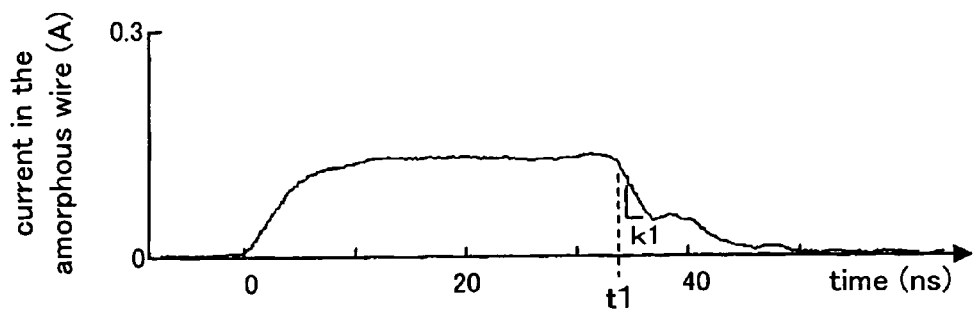
FIG. 13A is a graph of current variation passing through the amorphous wire with respect to time.
Figure 13B:
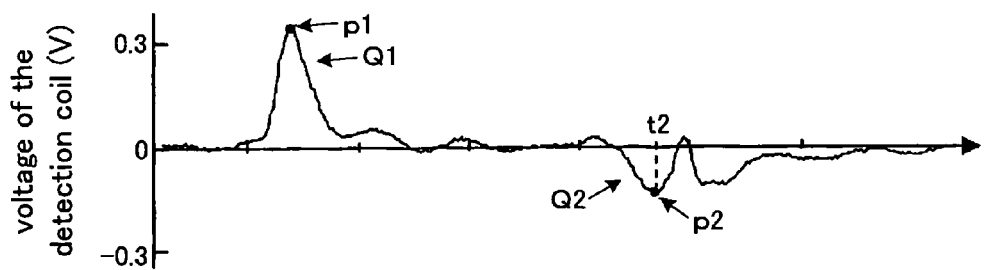
FIG. 13B is a graph of voltage in the detection coil with respect to time when the external magnetic field acting on the magnetic detection unit is +2G.
Figure 14:
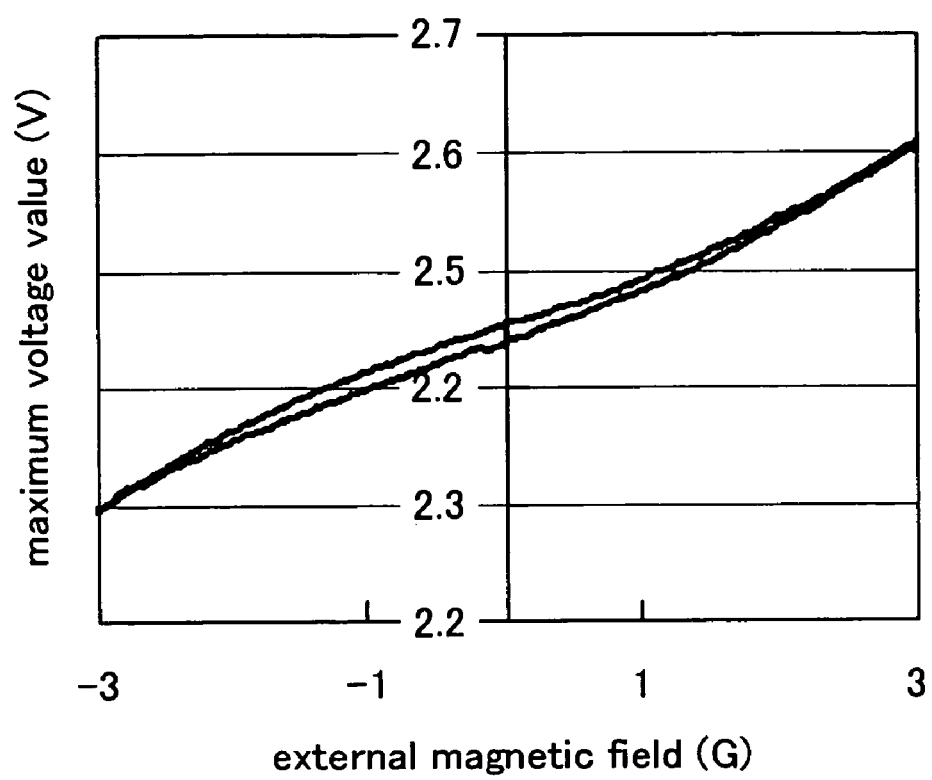
FIG. 14 shows the characteristics of the maximum voltage value (V) in the detection coil measured in synchronization with a rise of the pulse current with respect to the external magnetic field (G).

In a case where the first peak value of the induced voltage is detected by the use of the sample-and-hold circuit, as shown in FIG. 13B, a peak value p2 in the damped oscillation voltage Q2 can be detected, so that the magnetic sensor can have high precision.

Preferably, the sample-and-hold circuit may comprise timing-retaining means for retaining a predetermined timing in response to the interruption of the current performed by the driving circuit, and the sample-and-hold circuit is configured to measure the induced voltage value in synchronization with the interruption of the current with the predetermined timing, wherein the predetermined timing is equal to a timing at which the induced voltage value in damped oscillation exhibits the first zero-crossing in time in the interruption of the current passing through the magnetic sensitive member held in the external magnetic field whose intensity is substantially zero.

The zero crossing herein refers to polarity inversion, in which a positive (negative) value is inverted to a negative (positive) value in the induced voltage value in damped oscillation.

Even if an acting external magnetic field is substantially zero, a voltage is induced in the detection coil when the current passing through the magnetic sensitive member is interrupted. This induced voltage results from electromagnetic induction between the detection coil and the magnetic sensitive member or the like, so the induced voltage is generated independently of the external magnetic field.

The timing at which the induced voltage value in damped oscillation exhibits a zero crossing is the timing at which the induced voltage value generated in the detection coil independently of the external magnetic field becomes zero.

In the magnetic sensor, the timing at which the induced voltage value in damped oscillation exhibits the first zero-crossing in time is retained as the predetermined timing and the external magnetic field is measured by operating the sample-and-hold circuit in synchronization with interruption at this the predetermined timing. As a result, a voltage component generated independently of the external magnetic field due to electromagnetic induction between the detection coil and the magnetic sensitive member or the like is less prone to being contained as an error component. Therefore, according to the magnetic sensor, the induced voltage value generated by the action of the external magnetic field can be measured with high precision.

The timing-retaining means may be, for example, a delay circuit in which a coil, a resistor, and a capacitor are selectively combined. The timing-retaining means may use a timer capability of a microcomputer.

Preferably, the driving circuit may comprise voltage-retaining means for retaining a minimum voltage value being the induced voltage value measured by the sample-and-hold circuit when the external magnetic field having a minimum magnetic field intensity detected by the magnetic sensor acts on the magnetic sensitive member; and the driving circuit is configured to interrupt the current in a state in which the induced voltage value converges within a voltage range equal to or less than 5% of the minimum voltage value.

In a state in which the induced voltage value converges in the voltage range, when the current is interrupted, the induced voltage value can be measured afterwards with high precision by using the sample-and-hold circuit.

The state in which the induced voltage value converges in the voltage range refers to a state in which the damped oscillation voltage induced in the detection coil in response to a rise of the current stays within the voltage range.

Additionally, the voltage-retaining means may be such that the induced voltage value is input to an envelope detecting circuit in which a diode and a CR circuit are combined and the convergence is measured by comparing an output voltage value from the envelope detecting circuit with a threshold value. The voltage-retaining means may be such that a second sample-and-hold circuit for sampling and holding a peak value of the induced voltage value is added and the convergence is measured by comparing a voltage measured by the second sample-and-hold circuit and a threshold value.

Preferably, the driving circuit may be configure so that a pulse current variation serving as the current acts on the magnetic sensitive member; and a rise time required to raise the magnitude of the current up to a predetermined current value is set to be from 3 to 30 times an interruption time to interrupt the current at the predetermined current value.

In this case, setting the rise time to be 3 or more times the interruption time can strongly suppress the induced voltage value resulting from the rise of the current, as compared with the induced voltage value resulting from the interruption of the current. Suppressing the induced voltage value during this rise can control relative effects on the induced voltage value to be measured, and thus, the measurement precision of the magnetic sensor can be improved.

The rise time refers to the time required for the current to rise from 10% to 90% of a predetermined current value. The interruption time refers to the time required for the current to fall from 90% to 10% of the predetermined current value. The predetermined current value refers to the magnitude of the current when interrupted.

Preferably, the driving circuit may comprise a capacitor storing electric energy serving as a supply source of the current and an electronic switch arranged in an electrical path between the capacitor and the magnetic sensitive member; and the current supplied from the capacitor to the magnetic sensitive member is interrupted by the use of the electronic switch.

In this case, the use of the driving circuit including the capacitor and the electronic switch allows the rate of change of current to become large, so that the detectivity of the magnetic sensor can be further improved.

Preferably, the magnetic sensor may further comprises an electrode wiring board having a groove extending in one direction, the groove filled with an insulator having an electrical insulating property, wherein the magnetic sensitive member is an amorphous wire arranged so as to pass through the insulator along the groove direction of the groove; and the detection coil has a spiral electrical path in which a first coil unit arranged on a groove surface being an inner surface of the groove and a second coil unit arranged on a groove top being an outer surface of the insulator are combined.

In this case, the magnetic sensor has the structure in which the detection coil, which has the first coil unit formed on the inner surface of the groove and the second coil unit formed on the top face of the groove in combination, and the amorphous wire, which passes through the insulator in the groove, are combined. Therefore, the miniaturization of the magnetic sensor can be realized.

It is highly desired that a magnetic sensor used to measure direction in, for example, a small electronic device, such as a cellular phone or personal digital assistant, be miniaturized and reduced in profile. The magnetic sensor described above sufficiently meets the requirements and specifications with respect to size required for the miniaturization or the reduction in profile.

Preferably, the magnetic sensitive member may be an amorphous wire having a diameter from 1 μm to 30 μm; and the detection coil has a winding inner diameter equal to or less than 200 μm.

In this case, setting the winding inner diameter to be equal to or less than 200 μm allows the reduction in the gap between the amorphous wire skin and the detection coil. If the gap is reduced, excitation obtained from the skin effect in the magnetic sensitive member including the amorphous wire can be effectively utilized. As a consequence, the induced voltage value in the detection coil can be large, so that a high-sensitivity magnetic sensor can be realized.

EMBODIMENTS

Embodiment 1

Embodiment 1 of the present invention will be described with reference to FIGS. 1, 2, 13A, and 13B.

FIG. 1 is a schematic circuit diagram of a magnetic sensor according to this embodiment. Referring to FIG. 1, a magnetic detection unit 1 is composed of a zero-magnetostriction amorphous wire 11 having a length of 2.5 mm and a diameter of 30 μm, serving as a magnetic sensitive member, and being made out of a CoFeSiB-based alloy; a detection coil 12 consisting of 40 turns wound around the amorphous wire 11; and a current controlling resistor R11. The amorphous wire 11 is connected to an output terminal P2 of a pulse generator 2 via the resistor R11 so as to allow a pulse current to pass therethrough.

The detection coil 12 is connected to an input terminal P3 of an electronic switch of a sample-and-hold circuit 3 so as to output a voltage based on an induced voltage generated in accordance with an external magnetic field when the pulse current is interrupted.

The pulse generator 2 is composed of a multivibrator including complementary MOS (CMOS) inverter elements L21 and L22, a resistor R21, and a capacitor C21; and a wave-shaping circuit including a CMOS inverter element L23 and a differentiating circuit having a capacitor C22 and a resistor R22.

The wave-shaping circuit is electrically connected to the multivibrator. The wave-shaping circuit repeatedly generates a pulse voltage in which a time period of a logic level "1" is 35 nanoseconds (ns) at 1 MHz when the multivibrator generates a rectangular wave having a frequency of 1 MHz, and outputs the pulse voltages to the output terminal P2.

Therefore, a pulse current is passed through the amorphous wire 11 for 35 ns. As a result, a damped oscillation voltage that corresponds to an external magnetic field where the magnetic detection unit 1 is disposed is thus induced in the detection coil 12.

The sample-and-hold circuit 3 is composed of a sample-and-hold unit B31 including an electronic switch S31, a capacitor C32, a resistor R32, a resistor R33, and a high-input-resistance amplifier A31; and a delay circuit including a resistor R31 and a capacitor C31 connected to a control terminal of the electronic switch S31.

The other terminal of the delay circuit is connected to the output terminal P2 of the pulse generator. When a pulse is output from the output terminal P2, the delay circuit sets a logic level of the control terminal of the electronic switch S31 at "1" with a predetermined delay time determined by the resistor R31 and the capacitor C31.

Therefore, the electronic switch S31 is changed to the "closed" state and the induced voltage in the detection coil 12 is applied to the capacitor C32. Then, when the pulse in the output terminal P2 falls, the current passing through the amorphous wire 11 is interrupted and the electronic switch S31 is changed to the "open" state after a predetermined time interval Δt determined by the resistor R31 and the capacitor C31.

As shown in FIGS. 13A and 13B, this delay time Δt is adjusted to the time from when the current passing through the amorphous wire 11 is interrupted (time t1) to when the peak value p2, which is the maximum value of the damped oscillation voltage Q2, appears in the detection coil 12 (time t2). Therefore, the electronic switch S31 is changed to the "open" state substantially in synchronization with the timing of the appearance of the peak value p2. On the other hand, the capacitor C32 holds a voltage that is applied to the detection coil immediately before the electronic switch S31 is changed to the "open" state.

The high-input-resistance amplifier A31 converts the voltage in the detection coil into a direct-current voltage so as to output a voltage that corresponds to the magnitude of the external magnetic field to an output terminal P4, and continues outputting until the next pulse in repeated pulses at 1 MHz updates it.

Figure 2:
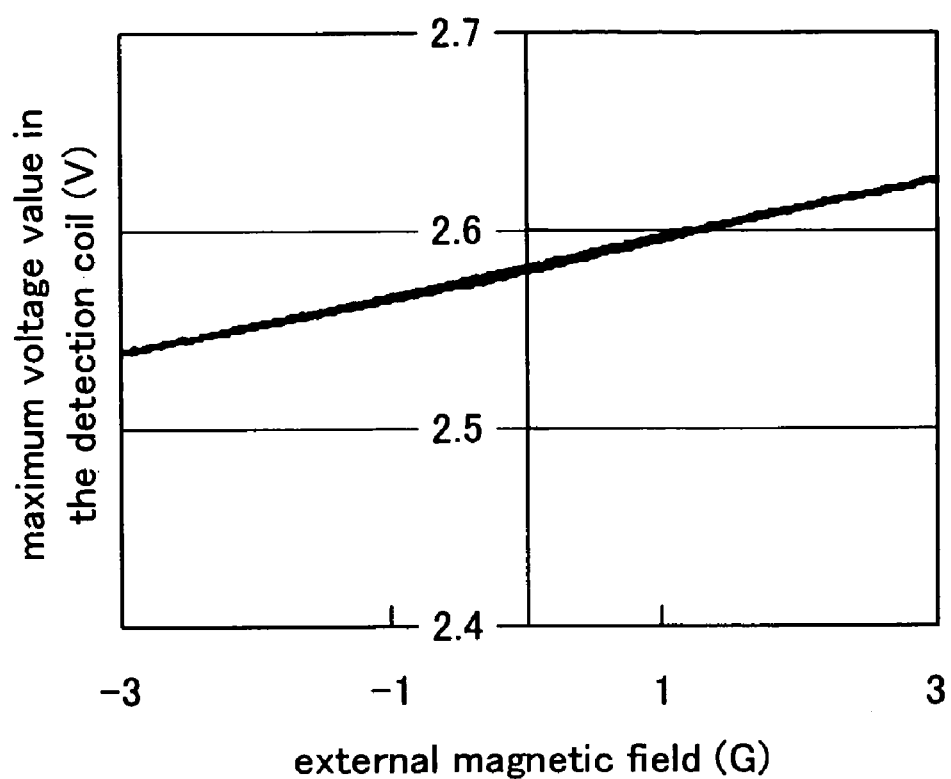
FIG. 2 shows the characteristics of a maximum voltage value in a detection coil with respect to an external magnetic field according to embodiment 1.

FIG. 2 shows results obtained when the magnetic field applied to the magnetic detection unit is varied in the range of ±3G. This drawing illustrates results obtained when a voltage of the peak value p2, which is the maximum value of the damped oscillation voltage Q2 induced in the detection coil 12 when the pulse current is interrupted, is converted to a direct-current voltage by the sample-and-hold circuit. As is apparent from FIG. 2, the nonlinearity and hysteresis are both equal to or less than 2%, and therefore, the precision reaches practical levels for direction measurement.

Additionally, it is not necessary for the magnetic sensor circuit according to this embodiment to have a negative-feedback circuit. This eliminates the need for continuously passing a negative-feedback current through the negative-feedback circuit, so that low power consumption can be realized.

As explained above, the magnetic sensor according to this embodiment achieves the following advantages:
(1) The nonlinearity and hysteresis can be reduced.
(2) Since there is no need to use a negative-feedback circuit, a negative-feedback coil can be omitted, and thus, the number of electronic components can be decreased. The elimination of negative-feedback current can lead to lower power consumption.
(3) The precision can reach high levels.

Embodiment 2

Embodiment 2 of the present invention will now be described with reference to FIGS. 3 to 5, 13A, and 13B.

Figure 3:
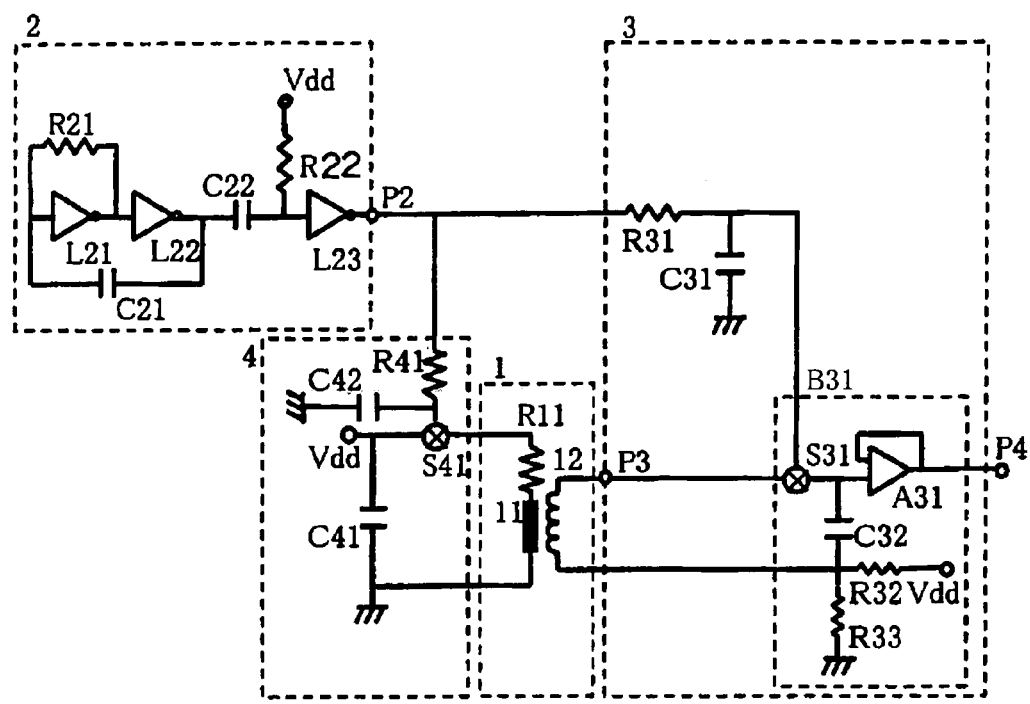
FIG. 3 is a schematic circuit diagram of the magnetic sensor according to embodiment 2.

FIG. 3 is a schematic circuit diagram of the magnetic sensor according to this embodiment. In FIG. 3, a driving circuit 4 for supplying a pulse current to the amorphous wire 11 is added to the circuit diagram of FIG. 1. Other circuits shown in FIG. 3 are the same as those in FIG. 1, so the driving circuit 4 will be described below.

The driving circuit 4 is composed of a capacitor C41 charged by a voltage Vdd (connected to an unshown stabilized power supply circuit); an electronic switch S41; and a delay circuit including a resistor R41 and a capacitor C42. The driving circuit 4 supplies a current to the resistor R11 and the amorphous wire 11 of the magnetic detection unit 1 from the capacitor C41 when the electronic switch S41 is in the "closed" state.

When a 35-ns-wide pulse voltage is output from the output terminal P2 of the pulse generator 2, a logic level of a control terminal of the electronic switch S41 is changed from "0" to "1" with a predetermined delay time realized by the delay circuit including the resistor R41 and the capacitor C42. After 35 ns, the logic level is changed back to "0" with the fall of the pulse voltage.

When the control terminal of the electronic switch S41 has a logic level of "1", the resistance of the electronic switch S41 is decreased and the electronic switch S41 is changed to the "closed" state. Therefore, a current is passed quickly from the capacitor C41, which is charged by the source voltage Vdd, to the resistor R11 and the amorphous wire 11 of the magnetic detection unit 1 via the electronic switch S41. Setting a time constant determined by the capacitance of the capacitor C41, the amorphous wire 11, and the resistor R11 at a sufficiently larger value than a pulse duration time of 35 ns can realize a pulse current maintaining a constant current value.

When a logic level of the control terminal of the electronic switch S41 is changed to "0", the resistance of the electronic switch S41 is increased and the electronic switch S41 is changed to the "open" state. Therefore, the current passing through the amorphous wire 11 is sharply interrupted and the logic level is changed to "0".

The delay circuit including the resistor R41 and the capacitor C42 is used to adjust the operation timing of the electronic switch S31 in response to an interruption of the current passing through the amorphous wire 11. In this embodiment, the delay time in the delay circuit is set such that the electronic switch S31 of the sample-and-hold circuit is changed to the "open" state at the timing at which the damped oscillation voltage induced in the detection coil 12 becomes a peak value.

The operation of switching between "closed" and "open" states performed by the electronic switch S41 is quicker than that by a CMOS inverter element, and moreover, the electronic switch S41 allows a large current to pass. Therefore, the rate of change of current with respect to the rise time and the fall time of a pulse current passing through the amorphous wire 11 can be large.

Figure 4A:
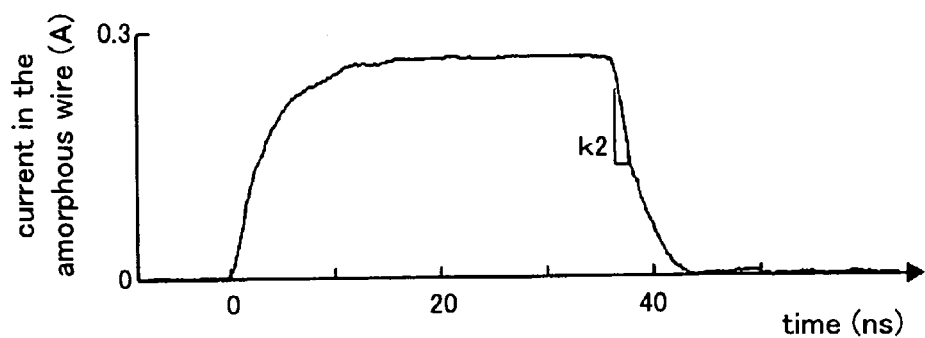
FIG. 4A shows the characteristics of a current in an amorphous wire with respect to the time for which a pulse current is passed through according to embodiment 2.
Figure 4B:
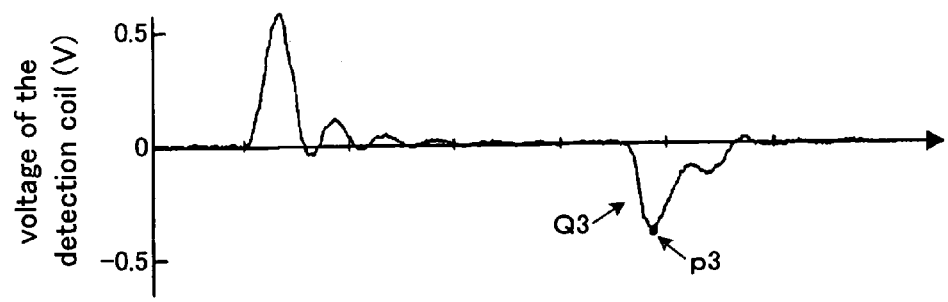
FIG. 4B shows the characteristics of a voltage of the detection coil with respect to the time for which the pulse current is passed through according to embodiment 2.

FIG. 4A shows current movements in the amorphous wire 11 when a pulse current (35 ns) is passed through the amorphous wire 11. FIG. 4B shows voltage movements in the detection coil.

As is apparent from these drawings, a gradient k2, which expresses the rate of change of current when the pulse current in the amorphous wire 11 is interrupted, is nearly twice as much as a gradient k1 shown in FIG. 13A, in which the CMOS inverter element performs driving. Therefore, the magnitude of a peak value p3 of the damped oscillation voltage induced in the detection coil 12 is nearly twice the peak value p2 as shown in FIG. 13B.

Figure 5:
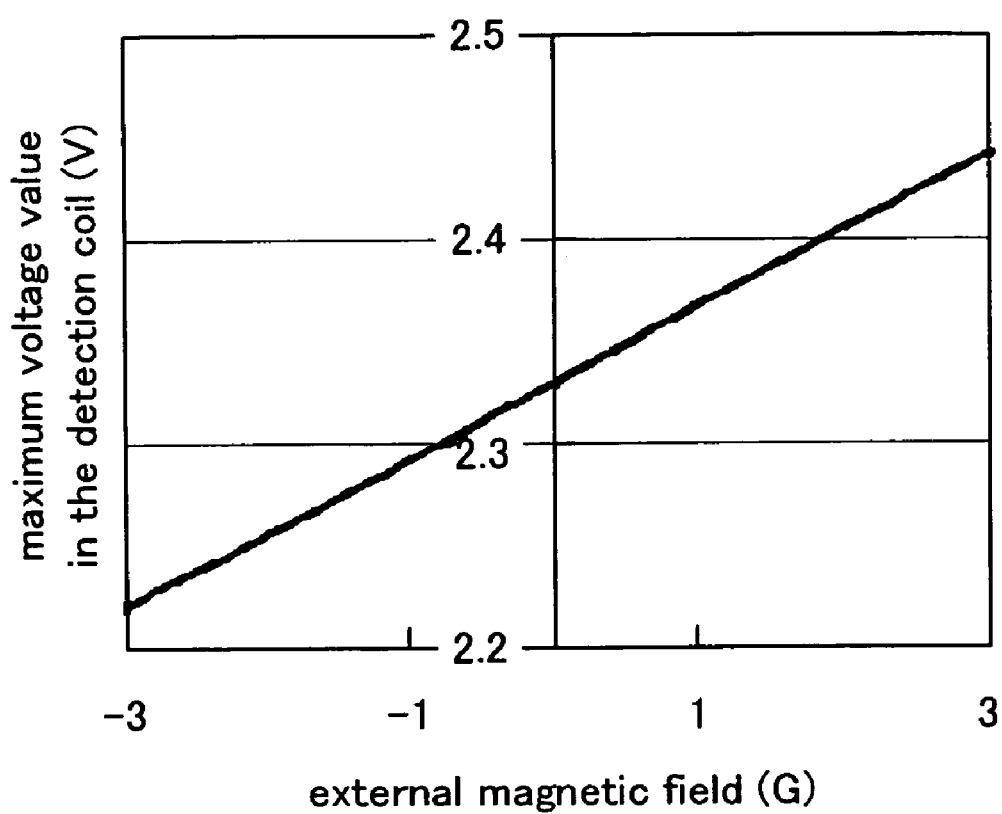
FIG. 5 shows the characteristics of the maximum voltage value in the detection coil with respect to the external magnetic field according to embodiment 2.

FIG. 5 shows the peak value p3 of the damped oscillation voltage induced in the detection coil when an external magnetic field acting on the magnetic detection unit 1 varies in the range of ±3G. As is apparent from this drawing, the sensitivity, i.e., the output voltage per unit magnetic field intensity is 0.037 V/G. This is approximately 2.5 times a sensitivity of 0.015 V/G in embodiment 1, as shown in FIG. 2.

As described above, in this embodiment, the driving circuit 4 to supply a pulse current to the amorphous wire 11 is added. The driving circuit 4 passes and interrupts a current supplied from the charged capacitor to the magnetic sensitive member by the use of its electronic switch. Therefore, the rate of change of a pulse current passing through the amorphous wire can be large, so that the precision of the magnetic sensor can be further improved. Other structures and advantages are the same as those of embodiment 1.

Embodiment 3

In this embodiment, based on embodiment 1, the delay time in the delay circuit is altered. The details will now be described with reference to FIGS. 1, 6A, and 6B.

Figure 6A:
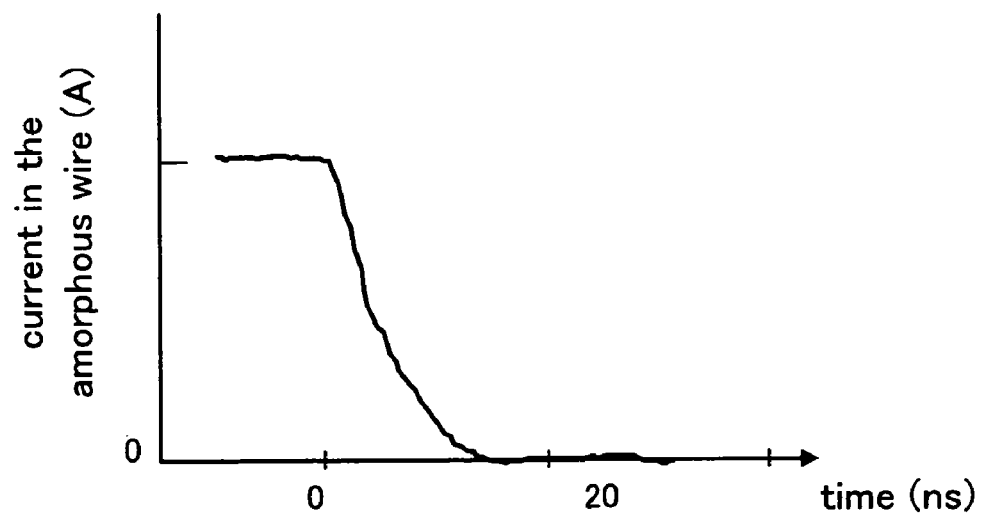
FIG. 6A is a graph of the pulse current varying with time according to embodiment 3.
Figure 6B:
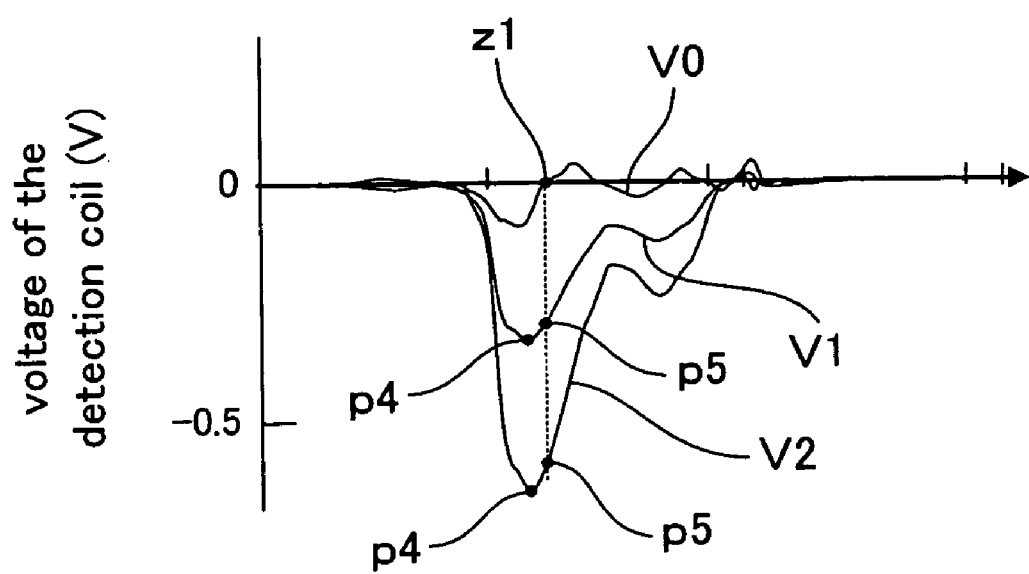
FIG. 6B is a graph of voltage variation in the detection coil with respect to the pulse current according to embodiment 3.

FIG. 6A shows variations in pulse current supplied to the amorphous wire 11 when the pulse current is interrupted. FIG. 6B shows variations in voltage induced in the detection coil of the magnetic detection unit (the reference numeral 1 in FIG. 1).

In FIG. 6B, the reference numeral V0 represents the variations in voltage when an external magnetic field acting on the magnetic detection unit is substantially zero. The reference numeral V1 represents the variations in voltage when the magnetic field intensity of the external magnetic field acting in the axial direction of the amorphous wire of the magnetic detection unit is 1 G. The reference numeral V2 represents the variations in voltage when the magnetic field intensity of the external magnetic field acting in the axial direction of the amorphous wire of the magnetic detection unit is 2 G.

When the acting external magnetic field is substantially zero, ideally, the voltage induced in the detection coil would be constantly zero. In practice, however, as shown in FIG. 6B by the reference numeral V0, a damped oscillation voltage having a small amplitude is produced in the detection coil due to electromagnetic induction between the amorphous wire and the detection coil or the like. This damped oscillation voltage V0 induced in the detection coil due to electromagnetic induction between the amorphous wire and the detection coil or the like is likely to be superimposed on the damped oscillation voltage V1 or V2 used to measure the external magnetic field. In other words, the voltage produced resulting from the electromagnetic induction between the amorphous wire and the detection coil or the like is likely to be a cause of measurement error in the magnetic sensor.

In this embodiment, the delay time in the delay circuit according to embodiment 1 is set to the time from when the current passing through the amorphous wire 11 is interrupted to when the first zero-crossing z1 in the damped oscillation voltage V0 appears in the detection coil, as shown in FIGS. 1 and 6B. Therefore, the electronic switch S31 is changed to the "open" state at the timing at which this first zero-crossing z1 appears. The capacitor C32 holds a voltage that is applied to the detection coil immediately before the electronic switch S31 is changed to the "open" state.

The high-input-resistance amplifier converts the voltage in the detection coil into a direct-current voltage, thereby outputting a voltage corresponding to the magnitude of the external magnetic field to the output terminal P4.

As described above, in this embodiment, the delay time in the delay circuit matches the timing at which the zero-crossing z1 (see FIG. 6B) of the damped oscillation voltage in the detection coil appears where the external magnetic field is substantially zero. Therefore, in the measurement of the external magnetic field by the magnetic sensor in this embodiment, an error due to electromagnetic induction between the amorphous wire and the detection coil or the like can be suppressed. Additionally, the delay time matches the first zero-crossing z1 in time. Therefore, when this delay time is set, a voltage value p5 whose magnitude is close to the peak voltage p4 can be measured as a voltage in the detection coil, as shown in FIG. 6B.

According to the magnetic sensor in this embodiment, an error due to electromagnetic induction between the amorphous wire and the detection coil or the like can be suppressed. This results in high-precision measurement.

Other structures and advantages are the same as those of embodiment 1.

Embodiment 4

In this embodiment, based on embodiment 2, the structure of the driving circuit is altered. The details will now be described with reference to FIGS. 7 and 8.

Figure 7:
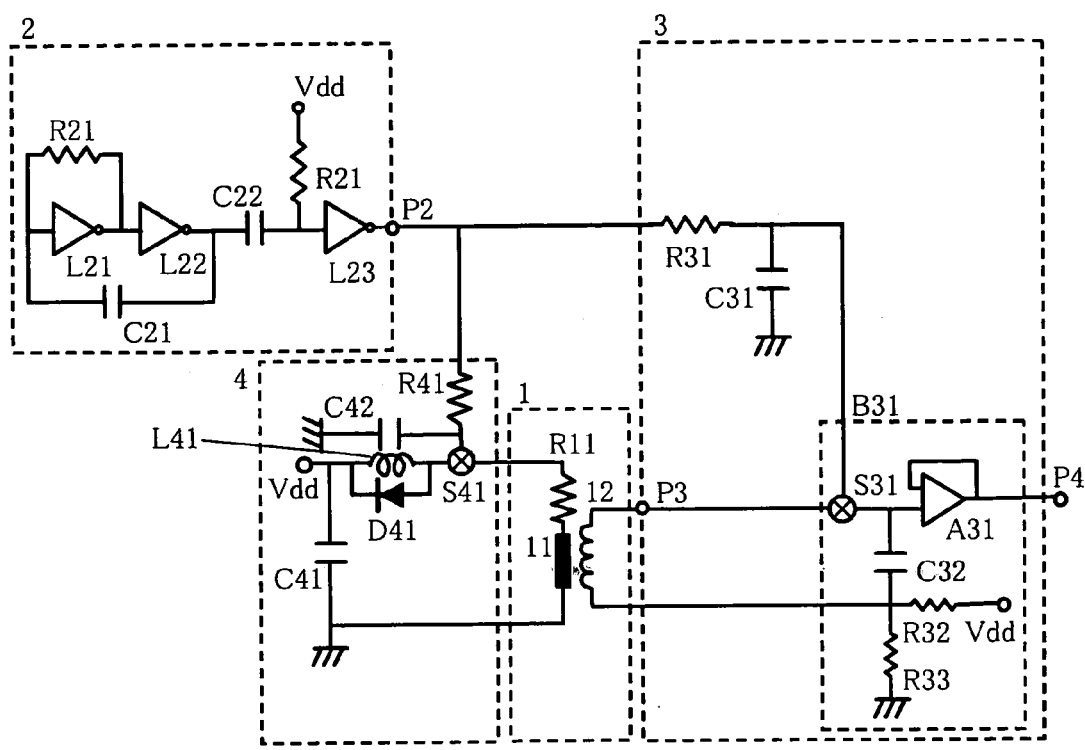
FIG. 7 is a schematic circuit diagram of the magnetic sensor according to embodiment 4.

In the driving circuit 4 according to this embodiment, as shown in FIG. 7, on the basis of the driving circuit described in embodiment 2, an inductance L41 is connected between the capacitor C41 and the electronic switch S41. This driving circuit 4 can generate a sawtooth current due to the first-order lag characteristics resulting from a time constant determined by the inductance L41 and the resistor R11 when the electronic switch S41 is changed to the "closed" state. In the driving circuit 4 according to this embodiment, a diode D41 is connected in parallel with the inductance L41. The diode D41 absorbs a surge voltage when the electronic switch S41 is changed to the "open" state.

Figure 8:
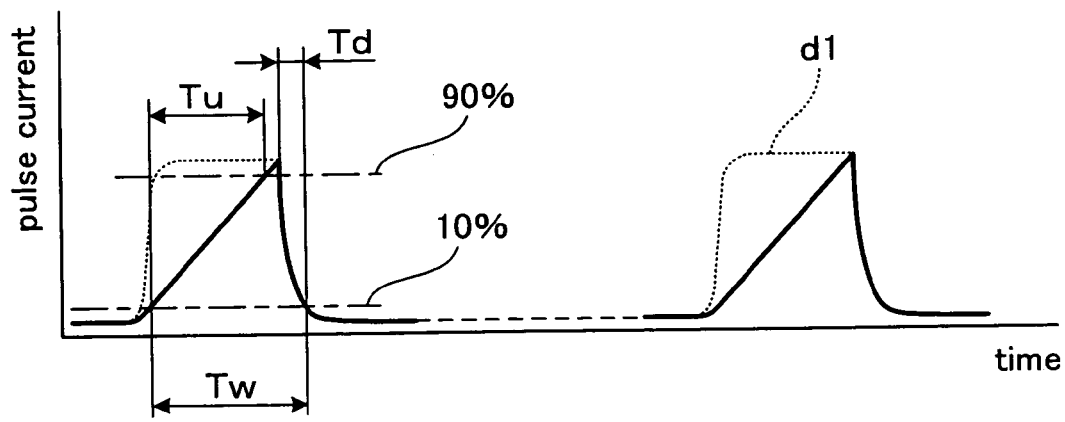
FIG. 8 is a graph showing variations in the pulse current according to embodiment 4.

As shown in FIG. 8, the driving circuit 4 can generate a sawtooth current having a gentle rise when the electronic switch S41 is changed to the "closed" state, i.e., when a current passing through the amorphous wire rises. Conversely, when the electronic switch S41 is changed to the "open" state, i.e., when the current passing through the amorphous wire is interrupted, the current can fall sharply, as compared with the rise described above. In this embodiment, a pulse current that is close to a sawtooth current is supplied to the amorphous wire.

In this embodiment, the rise time, Tu, is set to 20 ns and the interruption time, Td, is set to 3 ns. In other words, the rise time Tu in this embodiment is approximately 7 times the interruption time Td. The passage time, Tw, from the rise to the interruption is set to about 25 ns. The rise time Tu refers to the time required for the current to rise from 10% to 90% of its steady-state value. The interruption time Td refers to the time required for the current to fall from 90% to 10% of its steady-state value.

In this embodiment, the passage time Tw is determined so as to satisfy the following requirement: that is, the requirement is that the magnitude of the damped oscillation voltage induced in the detection coil associated with the rise of the current converges in a voltage range equal to or less than 5% of a minimum voltage value, which will be described later. The minimum voltage value refers to the magnitude of the induced voltage value measured by the sample-and-hold circuit when the external magnetic field having the minimum magnetic field intensity detected by the magnetic sensor acts on the magnetic sensitive member.

As explained above, the driving circuit 4 passes a current rising gently at the time of passing the pulse current through the amorphous wire. Therefore, as compared with when a pulse current that is close to perfect is supplied (shown by a dotted line d1), power consumption can be reduced and the energy-saving effects can be achieved. Moreover, when the rate of change of current at the time of the current passing through the amorphous wire to rise is made smaller (the current rises gently), the amplitude of the oscillation voltage produced in the detection coil can be suppressed. If the current passing through the amorphous wire is interrupted in a state in which the amplitude of the oscillation voltage in the detection coil is small, the voltage generated in accordance with the external magnetic field can be measured with high precision. In other words, since the oscillation voltage resulting from the rise of the current converges promptly, interrupting the current immediately so as to measure the external magnetic field is allowed. As a result, the passage time can be reduced and the energy-saving effects can be achieved.

In this embodiment, the sawtooth current is used. As an alternative to this, an imperfect pulse current having a longer rise time relative to the interruption time may be used. This imperfect pulse current can be realized by adjusting the time constant in the driving circuit 4 of this embodiment. For example, if the rise time is set to be from 3 to 30 times the interruption time, the advantages in this embodiment are achieved.

Embodiment 5

Figure 9:
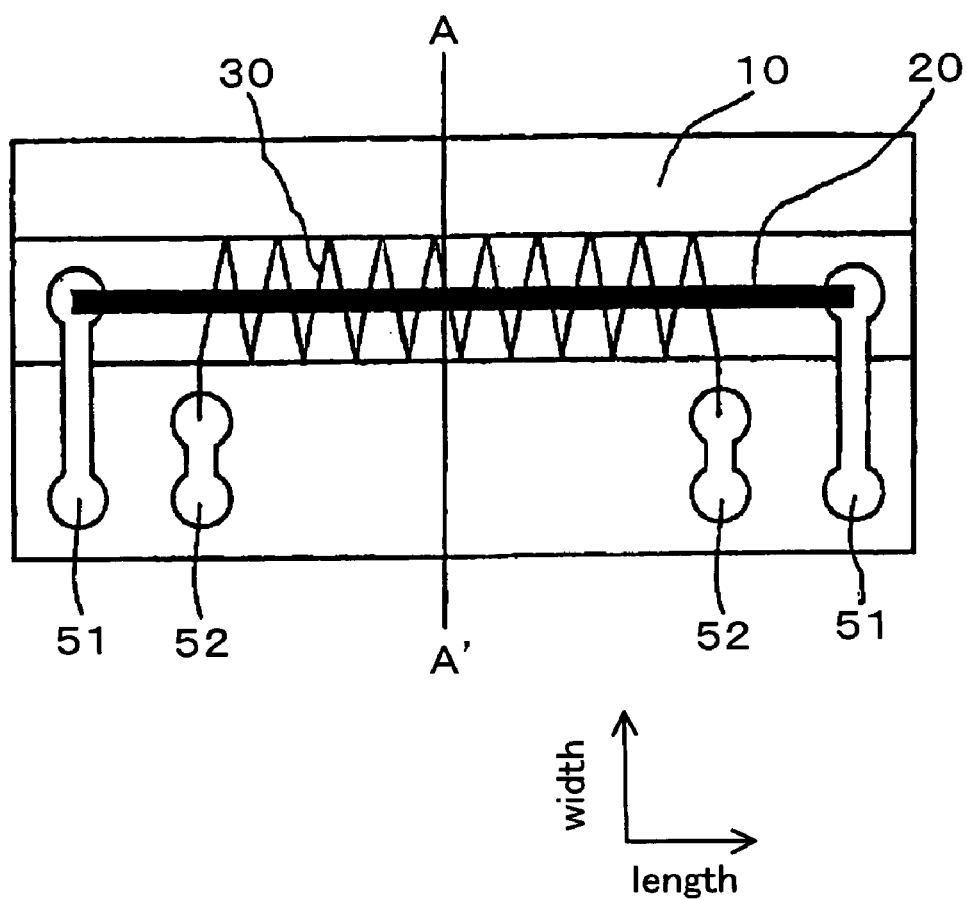
FIG. 9 is a front view of a magneto-impedance element according to embodiment 5.
Figure 10:
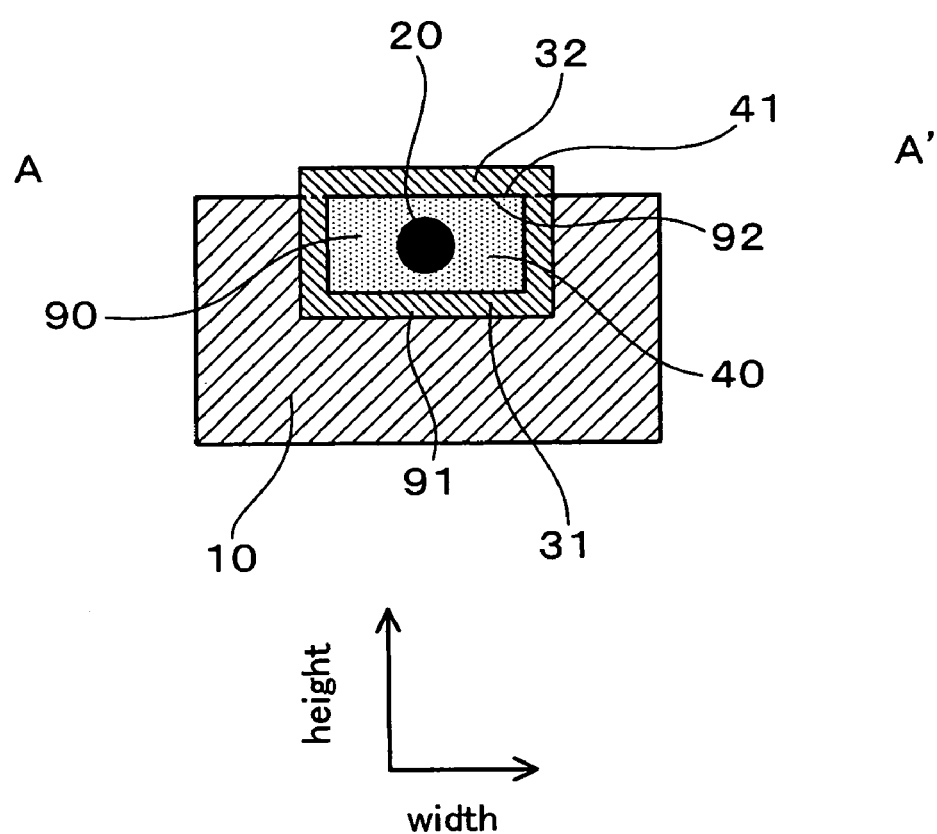
FIG. 10 is a conceptual sectional view taken along line A–A' of the illustration showing the magneto-impedance element according to embodiment 5.
Figure 11:
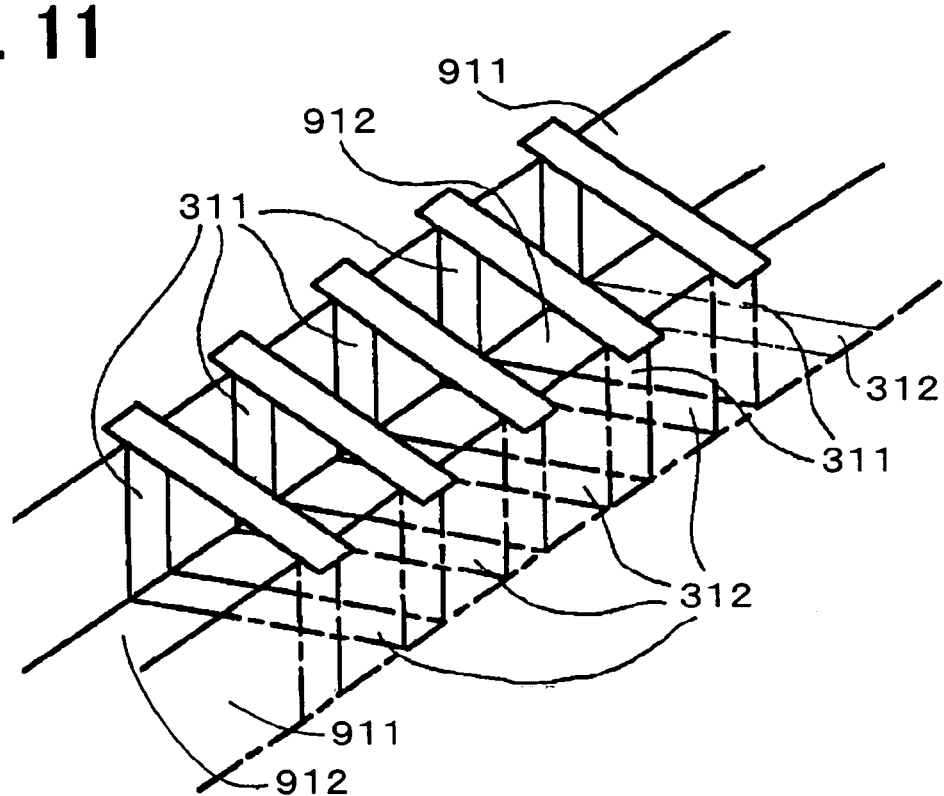
FIG. 11 is a perspective view showing how the spiral detection coil disposed within a groove is arranged according to embodiment 5.

In the present invention, the embodiment of a magneto-impedance element including the magnetic detection unit having an amorphous wire through which a pulse current can be passed and a detection coil wound around the magnetic sensitive member will now be described with reference to FIGS. 9 to 12. Referring to FIGS. 9 and 10, only an insulating member 40 is disposed between a magnetic sensitive member 20 for detecting a magnetic field and a detection coil 30 on an electrode wiring board 10. In this embodiment, the detection coil 30 having a winding inner diameter equal to or less than 200 μm is arranged around the insulating member 40. Terminals of the magnetic sensitive member 20 and the detection coil 30 are connected to their respective electrodes 51 and 52 on the electrode wiring board 10. The magneto-impedance element passes a pulse current through the magnetic sensitive member 20 via the electrodes 51 and 52 and outputs a voltage generated at that time in the detection coil 30.

Since only the insulating member 40 is disposed between the magnetic sensitive member 20 and the detection coil 30 in the magneto-impedance element, the winding inner diameter of the detection coil 30 is reduced to 200 μm or less. The winding inner diameter herein refers to a circle-equivalent diameter, which is equal to a diameter of a circle having the same area as a cross-sectional area defined by the height and width of a groove shown in FIG. 10. If the winding inner diameter is enlarged, a gap between the magnetic sensitive member and the detection coil is increased, thus failing to realize high sensitivity. It is desired that the magneto-impedance element be miniaturized. In view of these circumstances, the winding inner diameter is 200 μm or less in this embodiment.

The magnetic sensitive member 20 is a conductive magnetic amorphous wire made out of a CoFeSiB-based alloy and having a diameter of 10 to 30 μm. It is preferable that the diameter of the magnetic amorphous wire be 10 to 30 μm in terms of manufacturability. The electrode wiring board 10 has a groove 90 having a depth of 40 to 200 μm. For the detection coil 30, a detection coil portion 31 (a first coil unit 31) is arranged on a groove surface 91, and a detection coil portion 32 (a second coil unit 32) is arranged on a groove top 92 of the groove. The detection coil 30 has a two-tier structure consisting of the first coil unit 31 and the second coil unit 32.

The dimensions of the electrode wiring board 10 in this embodiment are 0.5 mm wide by 0.5 mm high by 1.5 mm long. The magnetic sensitive member is the amorphous wire 20 made out of a CoFeSiB-based alloy and having a diameter of 20 μm. The dimensions of the groove 90 are 50 μm deep by 70 μm wide by 1.5 mm long. The detection coil 30 has a two-tier structure consisting of the first coil unit 31 formed on the groove surface 91 and the second coil unit 32 formed on the groove top 92.

As shown in FIG. 10, the first coil unit 31 formed on the groove surface 91 is formed by selectively removing a thin conductive metal layer formed by vapor deposition over the entire area of the groove surface 91 of the groove 90 and the adjacent area to the groove 90 on the top surface of the electrode wiring board 10. Specifically, the first coil unit 31 has interstices in spaces in the spiral thin metal layer by the use of selective etching so that the thin metal layer in the shape of a spiral remains.

More specifically, on groove sides 911 of the groove 90, a plurality of coil strips 311, which are vertically arranged, are disposed in the groove direction. On a groove bottom face 912 of the groove 90, a plurality of coil strips 312, which are inclined relative to the width direction, are disposed in the groove direction. Each of the coil strips 312 connect a first segment of the coil strip 311 to a third segment of the coil strip 311 facing a second segment of the coil strip 311 adjacent to the first segment of the coil strip 311 in the groove direction. Therefore, the first coil unit 31 having the coil strips 311 and 312 in combination takes the form of a spiral as a whole.

The second coil unit 32 formed on the groove top 92 (the second coil unit 32 formed on a top face 41 of the insulating resin member 40) comprises a thin conductive metal layer formed by vapor deposition over a wide area including the groove top 92 in the longitudinal direction of the electrode wiring board 10. In this embodiment, the second coil unit 32 is formed by the application of selective etching to this thin metal layer. Specifically, portions of the metal thin layer are removed by selective etching so that a plurality of thin metal layer strips arranged along the width direction of the groove 90 is formed. In this embodiment, the second coil unit 32 is formed so as to connect the coil strips 311 facing each other together. On a top face of the second coil unit 32, a protective layer may be formed if needed.

The winding inner diameter of the detection coil 30 in this embodiment is 66 μm in circle-equivalent diameter. The detection coil has a winding spacing of 50 μm and has 20 turns.

A gap between the amorphous wire 20 and the detection coil 30 is filled with the insulating resin member 40, so that the conductive magnetic amorphous wire 20 is kept electrically insulated from the detection coil 30. On the top face of the electrode wiring board 10, four electrodes consisting of the terminals 51 extending from the opposite sides of the magnetic sensitive member 20 and the terminals 52 extending from the opposite sides of the detection coil 30 are baked. The size of the magneto-impedance element in this embodiment is substantially the same as that of the electrode wiring board.

Figure 12:
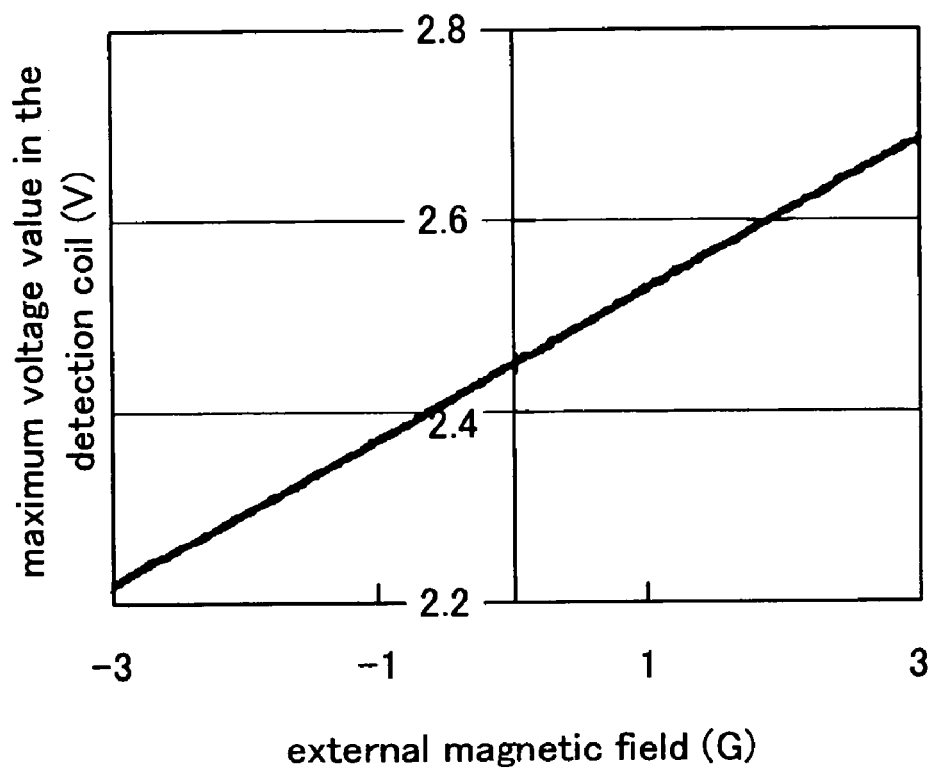
FIG. 12 shows the characteristics of the maximum voltage value (V) in the detection coil with respect to the external magnetic field (G) according to embodiment 5.

The magneto-impedance element is evaluated by the use of the circuit diagram (see FIG. 3) in embodiment 2. FIG. 12 shows the results. As is apparent from FIG. 12, a sensitivity of 0.076 V/G, superior to the sensitivity (see FIG. 5) realized in embodiment 2, is achieved.

Figure 15:
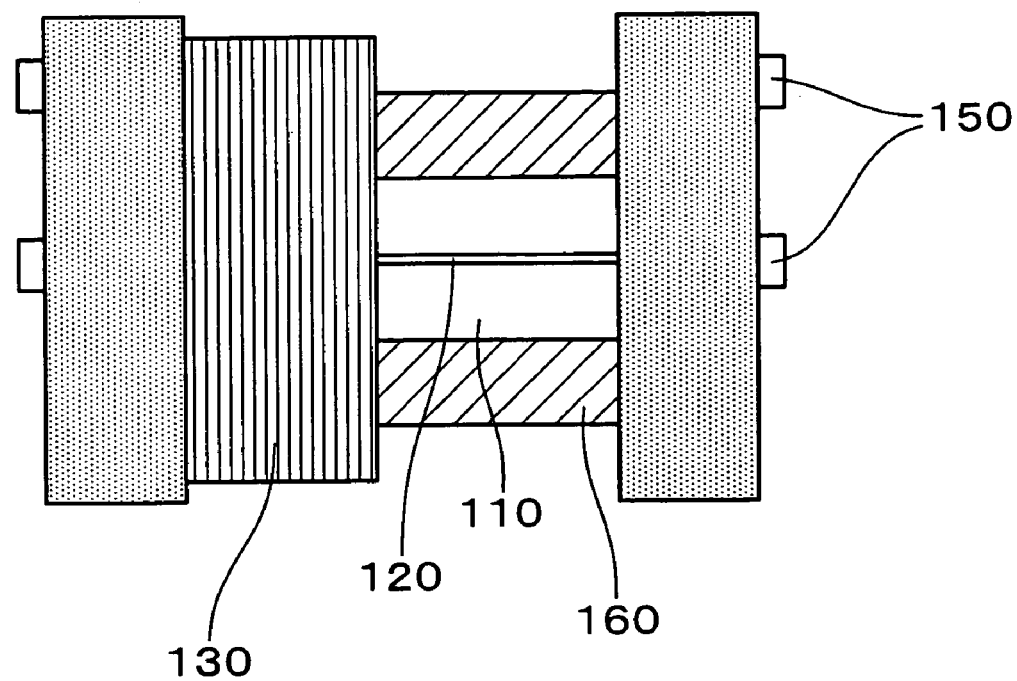
FIG. 15 shows one example of a magneto-impedance element in a known art.

The average gap between the amorphous wire and the detection coil in the magneto-impedance element is 23 μm, whereas that used in the magneto-impedance element of a known type according to embodiment 2 is approximately 1 mm. FIG. 15 shows one example thereof. The dimensions of a substrate 110 are 1.0 mm wide by 0.5 mm high by 2.5 mm long. On the substrate 110, an amorphous wire 120 made out of a CoFeSiB-based alloy and having a diameter of 30 μm is protected by a gelling resin member. A detection coil 130 is wound around the amorphous wire 120. An insulating winding frame 160 and electrodes 150 are provided. Accordingly, the high sensitivity (0.076 V/G) is realized by a reduction in gap between the amorphous wire serving as the magnetic sensitive member and the detection coil for detecting the output.

The miniaturized magneto-impedance element allows the magnetic sensor to be miniaturized and reduced in profile.

The invention claimed is:

1. A magnetic sensor comprising:
  a magnetic sensitive member whose electromagnetic characteristics vary by the action of an external magnetic field;
  a driving circuit for supplying a current to the magnetic sensitive member;
  a detection coil wound around the magnetic sensitive member; and
  a sample-and-hold circuit for measuring an induced voltage value which is the magnitude of voltage induced in the detection coil,
  wherein the sample-and-hold circuit is configured to measure the induced voltage value in synchronization with an interruption of the current performed by the driving circuit.

2. The magnetic sensor according to claim 1,
  wherein the sample-and-hold circuit is configured to measure the first peak value in time in a damped oscillation waveform of the induced voltage value, the damped oscillation waveform varying with time in response to the interruption of the current.

3. The magnetic sensor according to claim 1,
  wherein the sample-and-hold circuit comprises timing-retaining means for retaining a predetermined timing in response to the interruption of the current performed by the driving circuit, and the sample-and-hold circuit is configured to measure the induced voltage value in synchronization with the interruption of the current with the predetermined timing,
  wherein the predetermined timing is equal to a timing at which the induced voltage value in damped oscillation exhibits the first zero-crossing in time in the interruption of the current passing through the magnetic sensitive member held in the external magnetic field whose intensity is substantially zero.

4. The magnetic sensor according to claim 1,
  wherein the driving circuit comprises voltage-retaining means for retaining a minimum voltage value being the induced voltage value measured by the sample-and-hold circuit when the external magnetic field having a minimum magnetic field intensity detected by the magnetic sensor acts on the magnetic sensitive member; and the driving circuit is configured to interrupt the current in a state in which the induced voltage value converges within a voltage range equal to or less than 5% of the minimum voltage value.

5. The magnetic sensor according to claim 1,
  wherein the driving circuit is configure so that a pulse current variation serving as the current acts on the magnetic sensitive member; and a rise time required to raise the magnitude of the current up to a predetermined current value is set to be from 3 to 30 times an interruption time to interrupt the current at the predetermined current value.

6. The magnetic sensor according to claim 1,
  wherein the driving circuit comprises a capacitor storing electric energy serving as a supply source of the current and an electronic switch arranged in an electrical path between the capacitor and the magnetic sensitive member; and
  the current supplied from the capacitor to the magnetic sensitive member is interrupted by the use of the electronic switch.

7. The magnetic sensor according to claim 1,
  further comprising an electrode wiring board having a groove extending in one direction, the groove filled with an insulator having an electrical insulating property,
  wherein the magnetic sensitive member is an amorphous wire arranged so as to pass through the insulator along the groove direction of the groove; and
  the detection coil has a spiral electrical path in which a first coil unit arranged on a groove surface being an inner surface of the groove and a second coil unit arranged on a groove top being a outer surface of the insulator are combined.

8. The magnetic sensor according to claim 7,
  wherein the magnetic sensitive member is an amorphous wire having a diameter from 1 μm to 30 μm; and
  the detection coil has a winding inner diameter equal to or less than 200 μm.

* * * * *